United States Patent [19]
Choi et al.

[11] Patent Number: 5,817,179
[45] Date of Patent: Oct. 6, 1998

[54] GAAS ANNEAL BOAT DESIGN AND METHOD FOR USE

[75] Inventors: Dong-Gi Choi, Kyungki-Do, Rep. of Korea; Hyungmo Yoo, Cupertino, Calif.

[73] Assignee: Samsung Electronics Co., Ltd., Seol, Rep. of Korea

[21] Appl. No.: 790,826

[22] Filed: Jan. 23, 1997

[51] Int. Cl.[6] .................................................. C23C 16/00
[52] U.S. Cl. ........................ 118/728; 438/796; 438/797
[58] Field of Search ............................. 118/728; 438/796, 438/797

[56] References Cited

U.S. PATENT DOCUMENTS 4,203,940  5/1980  Dietze ..................................... 264/154

*Primary Examiner*—Richard Bueker
*Attorney, Agent, or Firm*—Townsend and Townsend and Crew LLP

[57] ABSTRACT

An improved gallium arsenide anneal boat and method for annealing comprises a slot structure for holding a wafer-stack of first and second GaAs wafers and a silicon wafer in the slot structure prior to annealing. The silicon wafer is tightly held in a central slot to maintain a vertical position and the GaAs wafers are loosely held in outside slots to avoid the formation of slip lines. The GaAs wafers slightly adhere to the silicon wafer to maintain a vertical position to avoid bending. Additionally, the wafer-stacks are separated by more than about 1.25 inches and processed in arsine gas at about 1 atm. pressure to avoid hazing.

5 Claims, 2 Drawing Sheets

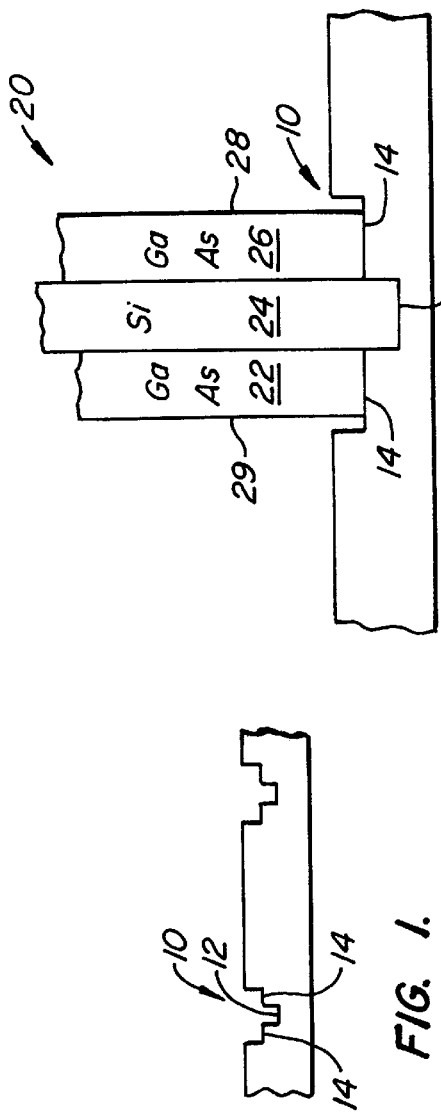
FIG. 1.
FIG. 2.
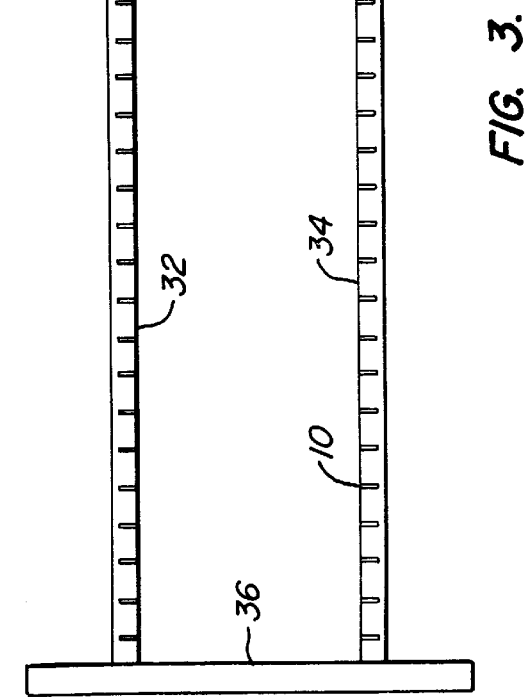
FIG. 3.

GAAS ANNEAL BOAT DESIGN AND METHOD FOR USE

BACKGROUND OF THE INVENTION

The invention relates generally to methods for processing GaAs wafers and more particularly relates to an improved apparatus and method for annealing GaAs wafers.

The microelectronics revolution has been sometimes called the silicon revolution because most semiconductor products are fabricated on silicon substrates. However, it has long been known that gallium arsenide (GaAs) is superior to silicon for high-frequency applications because of mobility of n-type carriers is much higher in GaAs than silicon.

Many of the fabrication steps for GaAs devices are similar to silicon fabrication steps. In particular, subsequent to implantation, GaAs wafers must be annealed. As is well-known, the annealing process involves placing the GaAs wafers in a boat held in a paddle, moving the loaded boat into an oven, and heating the wafers in an atmosphere arsine ($AsH_3$). The annealing process can cause defects in the wafer which reduce yield.

One type of defect is the formation of a slip line in the wafer. The formation of a slip line is due to pressure against the wafer caused by thermal expansion of the wafer during annealing. A typical slot utilized in an anneal boat is depicted in FIG. 6. The wafer fits snugly into the slot, and thus thermal expansion causes pressure against the wafer which produces a slip line. This line is a discontinuity in the wafer surface which destroys spatial relationships between structures on either side of the line.

An attempted solution to this problem is to make the slot larger. However, if the fit is not snug then the wafer will tilt during annealing with the result that the wafer will bend. As is well-known, subsequent fabrication steps will not be precise unless the wafer is flat.

Another wafer defect caused by the annealing process is hazing. The temperature dependence of the evaporation of gallium and arsenide molecules from the GaAs wafer is different. Thus, during the anneal, the arsenide content of the GaAs wafer diminishes to leave gallium droplets on the wafer surface which develops a haze. The introduction of arsine during the annealing process compensates arsenide evaporation to reduce the hazing.

With the increasing use of hand-held devices operating at high-frequency, consumer applications of GaAs devices are increasing. Previously, GaAs devices were mostly utilized in exotic applications where inefficiencies in production could be tolerated. As GaAs devices move into the commercial sector cost considerations require that yields be increased so that devices can be economically utilized in consumer products.

Accordingly, new techniques for increasing the yield of good circuits from each GaAs wafer are critical to reducing the cost of GaAs devices and facilitating the incorporation of such devices into consumer products.

SUMMARY OF THE INVENTION

According to one aspect of present invention, an improved anneal boat includes transverse rods having slot structures formed therein. Each slot structure includes a middle slot for tightly holding a middle silicon wafer in a vertical position and side slots for loosely holding first and second GaAs wafers. The first and second GaAs wafers adhere to the vertical middle silicon wafer to maintain a vertical orientation to avoid bending. However, since the GaAs wafers are loosely held in the side slots no slip lines form during the anneal step.

According to another aspect of the invention, wafer stacks are separated by at least about 1.25 inches during annealing to avoid hazing.

According to another aspect of the invention, the anneal is performed in a chamber filled with arsine pressurized to slightly higher than about 1 atm.

BRIEF DESCRIPTION OF THE DRAWINGS

FIG. 1 is schematic diagram of a slot structure;

FIG. 2 is a schematic diagram depicting a wafer stack in a slot structure;

FIG. 3 is a top view of a preferred embodiment of an anneal boat;

DESCRIPTION OF THE PREFERRED EMBODIMENT

Figure 4:
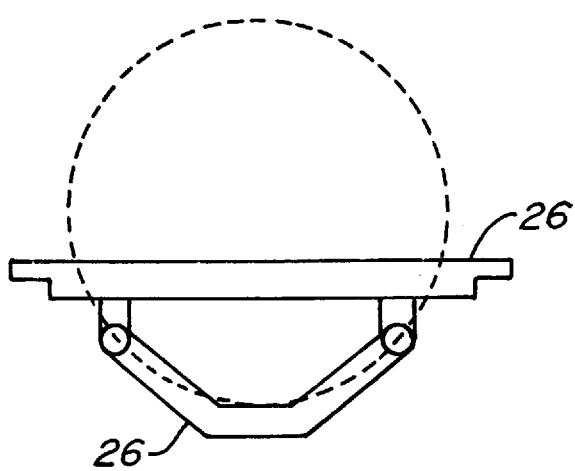
FIG. 4 is a side view of the anneal boat.

FIG. 1 is a cross-sectional diagram of a slot structure 10 utilized in a preferred embodiment of the invention. A central slot 12 is deeper than two outside slots 14. In the preferred embodiment, 3 or 4 inch GaAs wafers having a thickness of about 25 mils are processed. The structures for forming an integrated circuit are fabricated on a front side of the wafer. The backside of the wafer will subsequently be polished to reduce the thickness of the wafer to about 4 mills prior to dicing.

The cross-sectional thickness of the outer slots is 2 to 3 mills greater than the thickness of the GaAs wafer. Thus, there is room for the wafer to thermally expand during annealing without pressure from the slot.

During annealing a silicon wafer, is placed in the central slot. Because the silicon wafer is the same thickness as the central slot the silicon wafer stands vertically in the slot. A GaAs wafer is placed in each outside slot, with the back side of each GaAs wafer adjacent to the silicon wafer, to form a wafer-stack 20 of a first GaAs wafer 22, the middle silicon wafer 24, and a second GaAs 26 wafer. As depicted in FIG. 2, the front surfaces 28 and 29 of the GaAs wafers 22 and 26 are oriented away from the middle silicon wafer 24.

Referring now to FIG. 3, in the anneal boat 30 of a preferred embodiment the slot structures 10 are formed in first and second transverse rods 30 and 32 held place by first and second end rods 34 and 36. The slot structures 10 in the transverse rods 34 and 36 are aligned opposite from each other. The dimensions depicted in FIG. 3 are for an anneal boat that holds 4-inch wafers.

Figure 5:
FIG. 5 is a detail of "A" of FIG. 4.

FIG. 4 depicts a cross-sectional view of an anneal boat 30 with a 4-inch wafer shown in phantom. FIG. 5 is a detail of "A" in FIG. 4 showing that the bottoms of the slot structures 10 are aligned at 50° from horizontal for a 4-inch wafer.

The GaAs wafers lightly adhere to the silicon wafer and maintain a vertical position during the anneal process. Thus, the generation of slip lines is avoided because the GaAs wafer is not pinched by the outside slots when it thermally expands and bending of the GaAs wafer is avoided because the wafer maintains a vertical position.

The anneal boat may be constructed of quartz or silicon carbide. Silicon carbide is preferred because its thermal coefficient of expansion is almost equal to that of GaAs to further reduce the formation of slip lines during the anneal process.

Additionally, hazing is essentially eliminated if the wafer-stacks are separated by greater than about 1.25 inches and the annealing is performed in arsine gas pressurized to just above 1 atm.

EXPERIMENTAL RESULTS

Figure 6:
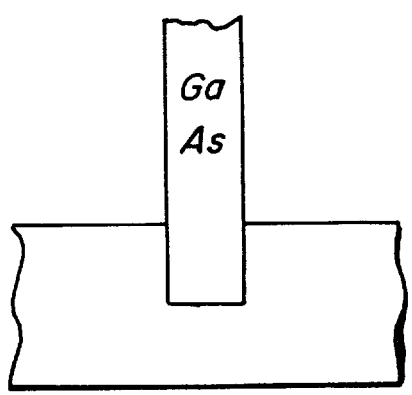
FIG. 6 is cross-sectional view of a slot in a prior art anneal boat.

The advantages of the design of the present invention over designs using the groove depicted in FIG. 6 or horizontal stack are set out in the table.

Sheet resistivity (Rsh) is used for the activation uniformity index.

| Wafer Loading | Visual Quality | On Wf Rsh Uniformity | Remarks |
| --- | --- | --- | --- |
| Horizontal (Stack) | Slip line | 30% | Slip line forms randomly |
|  | Defect at contact |  | Poor Wf to Wf uniformity |
| Vertical V-grove | Slip line | 3~6% | Slip lines at boat contact |
|  | Defect at contact |  | 6% (gas flows normal to Wf), 3% (gas flows normal to Wf) |
| This invention | Defect free | 2% | No slip line Wf to Wf unif <0.5% gas normal to wf |

The invention has now been described with reference to the preferred embodiments. Alternatives and substitutions will now be apparent to persons of skill in the art. Accordingly, it is not intended to limit the invention except as provided by the appended claims.

What is claimed is:

1. An improved boat used to hold GaAs wafers during an annealing process, with each GaAs wafer of a first predetermined thickness and having a front surface and a back surface, and with pairs of GaAs wafers having their back surfaces held adjacent to a silicon wafer of a second predetermined thickness during the anneal process, said boat comprising:

first and second elongated transverse members, having at a first slot structure formed therein, with said first slot structure comprising two outside slots and one central slot, with the outside slots having a cross-sectional dimension 2 to 3 mills greater than the first predetermined thickness of said GaAs wafer, and with the cross-sectional thickness of said central slot about equal to the second predetermined thickness;

first and second endpieces, each endpiece having coupling structures for attaching one end of an elongated transverse member to the endpiece, with said endpieces for holding said first and second elongated transverse members so that the members are substantially parallel and the first slot structures of each transverse member are disposed directly opposite from each other.

2. The boat of claim 1 wherein:

each of said slots has a substantially flat bottom section and said bottom sections are oriented to be tangential to an edge of a circular wafer disposed in said slot.

3. The boat of claim 1 wherein:

each elongated transverse member includes a second slot structure separated from said first slot structure by about 1.25 inches.

4. A method for annealing GaAs wafers in processing chamber, with the GaAs wafers being of a first predetermined thickness and having a front surface and a back surface, with the method utilizing a boat having slot structures formed therein, with said slot structure comprising two outside and one central slot, with the outside slots having a cross-sectional dimension 3 to 3 mills greater than the predetermined thickness of said GaAs wafer, and with the cross-sectional thickness of said central slot about equal to a second predetermined thickness, said method comprising the steps of:

providing a silicon wafer having said second predetermined thickness;

placing said silicon wafer in said central slot, with said silicon wafer being tightly held by said central slot to maintain a vertical orientation;

placing a GaAs wafer in each of said outside slots, with said back surfaces adjacent to the silicon wafer held in said central slot to form a horizontal wafer stack, so that the back sides of said GaAs wafers adhere to said silicon wafer to maintain a vertical orientation even though said GaAs wafers are not tightly held by said second slot, thereby avoiding the formation of slip lines.

5. The method of claim 4 further comprising the step of:

flowing arsine gas into the annealing oven to maintain a pressure of about one atmosphere;

providing GaAs wafers of a diameter of about 3 to 4 inches;

separating said wafer stacks by at least about 1.25 inches to avoid hazing during the anneal process.

* * * * *